US012812787B2

United States Patent
(12) United States Patent
Breuning et al.

(10) Patent No.: US 12,812,787 B2
(45) Date of Patent: Nov. 24, 2026

(54) ELECTRONIC MODULE, IN PARTICULAR AN ELECTRONIC POWER MODULE FOR HYBRID VEHICLES OR ELECTRIC VEHICLES

(71) Applicant: Robert Bosch GmbH, Stuttgart (DE)

(72) Inventors: Christian Breuning, Nuertingen (DE); Michael Mayer, Hohenstein (DE); Wolfram Kienle, Magstadt (DE); Uwe Rauscher, Hohenstein (DE)

(73) Assignee: Robert Bosch GmbH, Stuttgart (DE)

( * ) Notice: Subject to any disclaimer, the term of this patent is extended or adjusted under 35 U.S.C. 154(b) by 169 days.

(21) Appl. No.: 18/865,037

(22) PCT Filed: May 9, 2023

(86) PCT No.: PCT/EP2023/062259
§ 371 (c)(1),
(2) Date: Nov. 12, 2024

(87) PCT Pub. No.: WO2023/232400
PCT Pub. Date: Dec. 7, 2023

(65) Prior Publication Data
US 2025/0324513 A1 Oct. 16, 2025

(30) Foreign Application Priority Data
May 30, 2022 (DE) ..................... 10 2022 205 358.3

(51) Int. Cl.
*H05K 1/14* (2006.01)
*H05K 1/02* (2006.01)
(Continued)

(52) U.S. Cl.
CPC ............. *H05K 1/18* (2013.01); *H05K 1/0277* (2013.01); *H05K 1/14* (2013.01); *H05K 2201/10189* (2013.01)

(58) Field of Classification Search
CPC .................. H05K 1/14; H05K 1/0277; H05K 2201/10189; H05K 1/189; H05K 3/361; H05K 1/147
See application file for complete search history.

(56) References Cited

U.S. PATENT DOCUMENTS 6,053,747 A 4/2000 Aggus et al.
2006/0148308 A1* 7/2006 Pabst .................... H01R 12/78 439/495

(Continued)

FOREIGN PATENT DOCUMENTS

DE 4244626 A1 6/1994
DE 10048379 A1 4/2001

(Continued)

OTHER PUBLICATIONS

Translation of International Search Report for Application No. PCT/EP2023/062259 dated Sep. 6, 2023 (2 pages).

*Primary Examiner* — Sherman Ng
(74) *Attorney, Agent, or Firm* — Michael Best & Friedrich LLP

(57) ABSTRACT

The invention relates to an electronic module (1), in particular an electronic power module for hybrid vehicles or electric vehicles, said module comprising a first circuit board (10) with an upper side (11) and an underside (12) facing away from the upper side (11), wherein a plug-in connector (40) for making electrical contact with the first circuit board (10) is arranged on the first circuit board (10), further comprising an electronics unit (20), in particular a power electronics unit, wherein the electronics unit (20) is arranged on the underside (12) of the first circuit board (10), wherein the electronics unit (20) is electrically contacted by means of a flexible second circuit board (30), wherein the flexible second circuit board (30) comprises a connection region (31) with a plug-in region (32), wherein the plug-in (Continued)

region (32) of the flexible second circuit board (30) is plugged into the plug-in connector (40) of the first circuit board (10) in a plug-in direction (R), and the electronics unit (20) is thereby electrically contacted by the first circuit board (10). It is proposed that the plug-in connector (40) of the first circuit board (10) is arranged on the underside (12) of the first circuit board (10), wherein the connection region (31) of the flexible second circuit board (30) comprises at least one gripping region (33), wherein the gripping region (33) projects beyond the plug-in region (32) in the plug-in direction (R), wherein the gripping region (33) protrudes through a recess (13) in the first circuit board, (10) from the underside (12) of the first circuit board (10) to the upper side (11) of the first circuit board (10).

16 Claims, 3 Drawing Sheets

(51) Int. Cl.
*H05K 1/18* (2006.01)
*H05K 3/36* (2006.01)

(56) References Cited

U.S. PATENT DOCUMENTS

| | | | | |
|---|---|---|---|---|
| 2016/0254604 | A1* | 9/2016 | Loibl | H05K 5/0034 439/65 |
| 2018/0145435 | A1 | 5/2018 | Peralta et al. | |
| 2019/0296464 | A1* | 9/2019 | Taschner | H01R 12/585 |
| 2020/0221591 | A1* | 7/2020 | Liskow | H05K 5/064 |
| 2021/0020588 | A1 | 1/2021 | Jaksic et al. | |

FOREIGN PATENT DOCUMENTS

| | | | |
|---|---|---|---|
| DE | 102010063387 | A1 | 6/2012 |
| DE | 102019217186 | A1 | 5/2021 |
| JP | S60113674 | U | 8/1985 |
| JP | S63182574 | U | 11/1988 |
| JP | H01293592 | A | 11/1989 |
| JP | H0487675 | U | 7/1992 |
| JP | H05160339 | A | 6/1993 |
| JP | H06303778 | A | 10/1994 |
| JP | H06303779 | A | 10/1994 |
| JP | H07302672 | A | 11/1995 |
| JP | 2000277880 | A | 10/2000 |
| JP | 2007335719 | A | 12/2007 |
| JP | 2016046402 | A | 4/2016 |
| JP | 2016220277 | A | 12/2016 |
| WO | 2021044925 | A1 | 3/2021 |

* cited by examiner

ELECTRONIC MODULE, IN PARTICULAR AN ELECTRONIC POWER MODULE FOR HYBRID VEHICLES OR ELECTRIC VEHICLES

BACKGROUND

The invention relates to an electronic module, in particular an electronic power module for hybrid vehicles or electric vehicles, comprising the features according to the disclosure.

In hybrid vehicles or electric vehicles, inverter structures and converter structures are used which comprise, e.g., commutation circuits consisting of DC link capacitors and half bridges, which are formed in power modules. For example, inverters that provide phase currents to the electric machine are used to operate the electric machine.

The power modules are controlled via a circuit board that is electrically contacted by the power modules.

SUMMARY

Proposed according to the invention is an electronic module, in particular an electronic power module for hybrid vehicles or electric vehicles. The electronic module comprises a first circuit board with an upper side and an underside facing away from the upper side, a plug-in connector for making electrical contact with the first circuit board being arranged on the first circuit board. The electronic module further comprises an electronics unit, in particular a power electronics unit, the electronics unit being arranged on the underside of the first circuit board, and the electronics unit being electrically contacted by means of a flexible second circuit board, whereby the flexible second circuit board comprises a connection region with a plug-in region, whereby the plug-in region of the flexible second circuit board is plugged into the plug-in connector of the first circuit board in a plug-in direction and the electronics unit are thus electrically contacted with the first circuit board, whereby the plug-in connector of the first circuit board is arranged on the underside of the first circuit board, whereby the connection region of the flexible second circuit board comprises at least one gripping region, whereby the gripping region projects beyond the plug-in region in the plug-in direction, whereby the gripping region protrudes through a recess in the first circuit board from the underside of the first circuit board to the upper side of the first circuit board.

Compared to the prior art, the electronic module according to the invention has the advantage that the first circuit board can be connected and electrically contacted to the electronics unit particularly easily and well. The electronics unit is electrically contacted by the first circuit board via the flexible second circuit board. In the present electronic module, this advantageously be performed on the underside of the first circuit board, which faces the electronics unit. The plug-in region of the flexible second circuit board can advantageously be plugged into the plug-in connector of the first circuit board on the underside of the first circuit board. By means of the gripping region, which protrudes through the recess in the first circuit board from the underside of the first circuit board to the upper side of the first circuit board, the connection region of the flexible second circuit board can also be gripped on the upper side of the first circuit board. The plug-in region of the flexible second circuit board can thereby be plugged into the plug-in connector of the first circuit board on the underside of the first circuit board by pulling on the gripping region on the upper side of the first circuit board. The plug-in region and the plug-in connector are arranged between the first circuit board and the electronics unit and are difficult or impossible to access and see. By means of the gripping region on the upper side of the first circuit board, the plug-in region can nevertheless be plugged into the plug-in connector. A "blind joining" of the plug-in region into the plug-in connector in thus possible. By means of the recess in the first circuit board, the connection region is already oriented with the plug-in region in the direction of the plug-in connector. By pulling the gripping region away from the upper side of the first circuit board, the plug-in region can then be plugged into the plug-in connector. The process of plugging the plug-in region into the plug-in connector can advantageously be performed from the upper side of the first circuit board, although the plug and the plug-in connector are arranged on the underside of the first circuit board. The upper side of the circuit board is much more accessible for this process. The process cannot be performed directly on the underside of the first circuit board because the electronics unit makes access difficult or prevents it. Therefore, the electronic module still has an advantageously compact design because the plug-in connector can be arranged on the underside of the first circuit board, and the plug-in region of the flexible second circuit board can be plugged from the underside of the first circuit board. The plug-in region of the flexible second circuit board need not pass through or past the first circuit board onto the upper side of the first circuit board in order to be plugged into a connector of the first circuit board on the upper side of the first circuit board. Space is thus advantageously conserved on the first circuit board, enables the latter to have a compact design.

According to one advantageous exemplary embodiment, it is provided that at least two gripping regions are formed on the flexible second circuit board, whereby the plug-in region of the flexible second circuit board and the plug connector are arranged between the gripping regions of the second circuit board. The two gripping regions, each of which protrudes through a recess in the first circuit board from the underside of the first circuit board to the upper side of the first circuit board, for example, enable the plug-in region to be plugged straight and reliably into the plug-in connector. The connection region can be gripped at both gripping regions on both sides of the plug-in region and the plug-in connector and pulled away from the upper side of the first circuit board so that the plug-in region is plugged into the plug-in connector.

According to one advantageous exemplary embodiment, it is provided that the plug-in region and/or the gripping region are designed as a rigid region of the flexible second circuit board. Therefore, the gripping region and the plug-in region are thus rigidly connected to each other, and the direction in which the plug-in region is plugged into the plug-in connector corresponds to the direction in which the connection region is pulled by means of the gripping regions. The plug-in region can thus be securely and advantageously oriented on the underside of the first circuit board via the gripping regions on the upper side of the first circuit board and plugged into the plug-in connector.

According to one advantageous exemplary embodiment, it is provided that a centering device is arranged between the first circuit board and the electronics unit, whereby the flexible second circuit board is guided through a centering opening of the centering device, in particular in the plug-in direction, and the plug-in region of the flexible second circuit board is oriented thereby, at least one centering element being formed on the centering device, which centering element is in contact with the first circuit board, and by means of said element the first circuit board is oriented on the centering device. The centering device enables the connection region of the flexible second circuit board to be positioned advantageously relative to the first circuit board and the electronics unit. The centering opening in the centering device places the plug-in region in the correct position and orients it with the plug-in connector in the plug-in direction. By means of the centering element, the first circuit board, and thus the plug-in connector on the underside of the first circuit board, are oriented relative to the plug-in region of the flexible second circuit board.

According to an advantageous exemplary embodiment, the centering element is designed as a pin that protrudes through an orientation opening formed in the first circuit board. For example, when the first circuit board is placed on the centering device, it can be oriented on the centering element relative to the centering device and to the plug-in region of the flexible second circuit board.

According to one advantageous exemplary embodiment, it is provided that the centering device is designed as a plate, in particular as a support plate for the first circuit board. The centering device thus serves on the one hand as a support plate for the first circuit board and, on the other hand, to orient the plug-in region of the flexible second circuit board relative to the first circuit board, and thus to the plug-in connector of the first circuit board.

According to an advantageous exemplary embodiment, a holding device is provided on the electronics unit for holding and orienting the connection region of the flexible second circuit board. The holding device enables the connection region of the flexible second circuit board to be advantageously oriented and held in the direction of the plug-in connector before the plug-in region is plugged into the plug-in connector.

According to an advantageous exemplary embodiment, it is provided that the connection region of the flexible second circuit board is held in a first position by the holding device and oriented in the plug-in direction, and the connection region of the flexible second circuit board can be released from the holding device by pulling on the gripping region in the plug-in direction. The connection region can thus be oriented in the first position in order to arrange the centering device on the electronics unit, whereby, when the centering device is arranged on the electronics unit, the connection region of the flexible second circuit board is guided through the centering opening in the centering device.

According to one advantageous exemplary embodiment, it is provided that the holding device comprises a first holding part and a second holding part, whereby the first holding part and the second holding part are spaced apart by an intermediate space, whereby the connection region of the flexible second circuit board can be clamped into the intermediate space between the first holding part and the second holding part, so that the connection region is held by the holding device and oriented in the plug-in direction. In this way, a holding device is provided in which the connection region is oriented in the direction of the centering opening in the centering device and in the direction of the plug-in connector before the plug-in region is plugged into the plug-in connector. When pulling on the gripping region, the connection region of the flexible second circuit board can then be pulled out from the intermediate space between the first holding part, and the second holding part and the plug-in region can be plugged into the plug-in connector. If the plug-in region is plugged into the plug-in connector, then the holding device will longer hold the connection region.

According to an advantageous exemplary embodiment, it is provided that a latching element is formed on the first holding part and/or on the second holding part, which element projects into the intermediate space, whereby a latching opening complementary to the latching element is formed on the connection region of the flexible circuit board, into which the latching element can be latched. The latching element is used to hold the connection region on the holding device and advantageously ensures that the connection region is only released from the holding device by pulling on the gripping region when the plug-in region is plugged into the plug-in connector.

BRIEF DESCRIPTION OF THE DRAWINGS

Exemplary embodiments of the invention are shown in the drawings and are explained in more detail in the following description. Shown are.

DETAILED DESCRIPTION

The electronic module 1 according to the invention can be used in a variety of applications, for example as an inverter or converter in automotive engineering. For example, the electronic module can be designed as an inverter, also known as an inverter, and can be used to operate an electric machine, for example in hybrid or electric vehicles.

Figure 1:
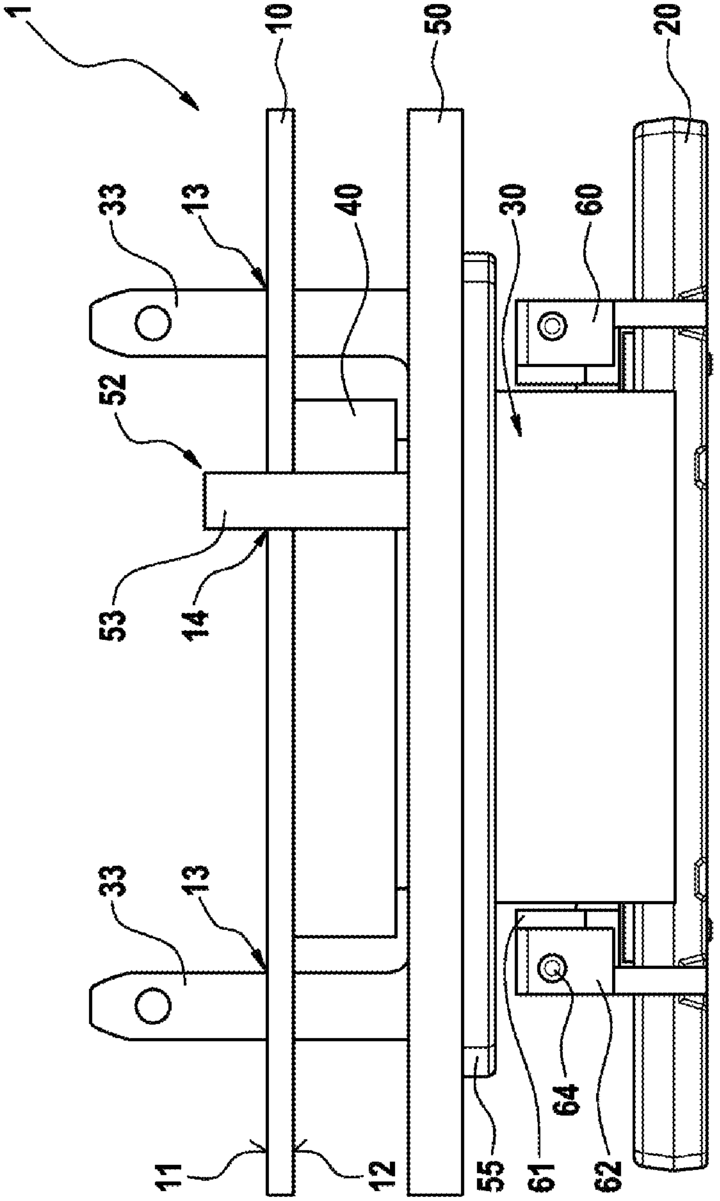
FIG. 1 one exemplary embodiment of the electronic module, in which the plug-in region of the flexible second circuit board is plugged into the plug-in connector, and the connection region of the flexible second circuit board is not held by the holding device, FIG. 2 a cross-section through the exemplary embodiment of the electronic module shown in FIG. 1, FIG. 3 one exemplary embodiment of the electronics unit comprising the holding device, the flexible second circuit board and the plug-in connector, whereby the plug-in region of the flexible second circuit board is not plugged into the plug-in connector, and the connection region of the flexible second circuit board is held by the holding device.
Figure 2:
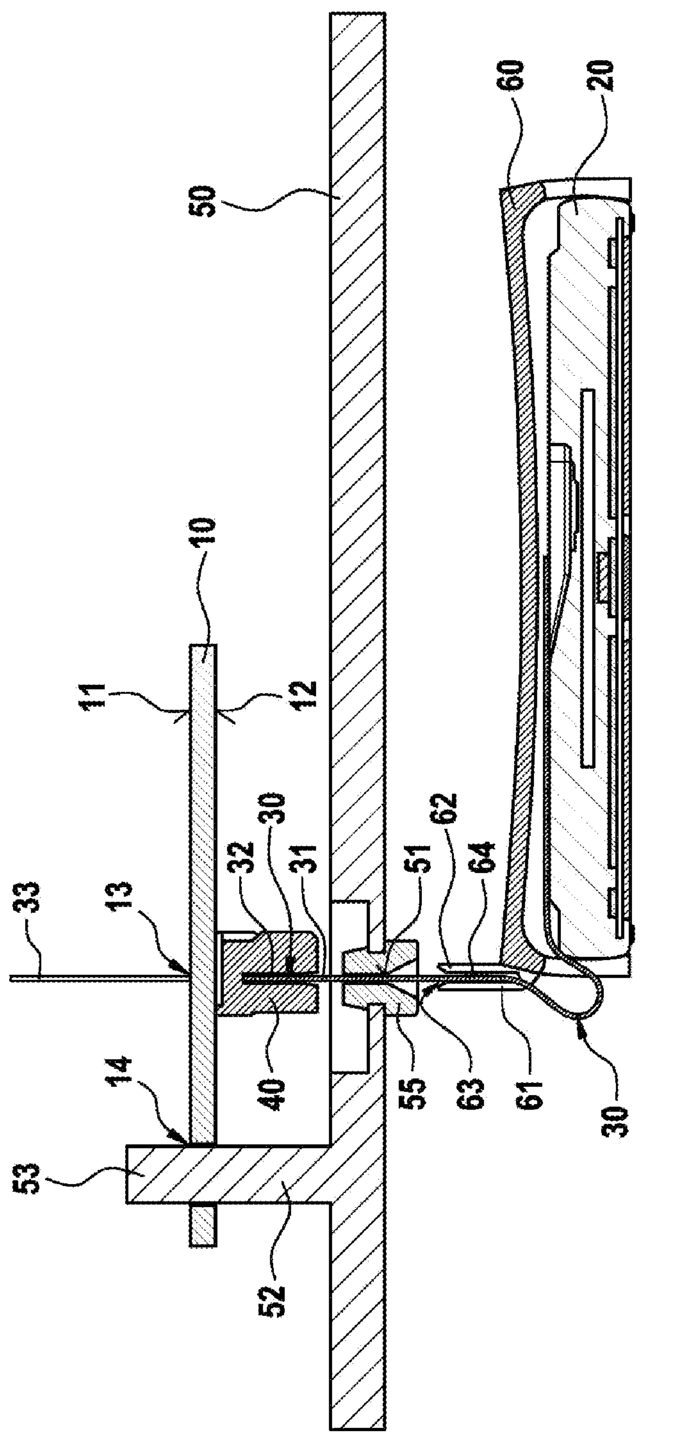
Figure 3:
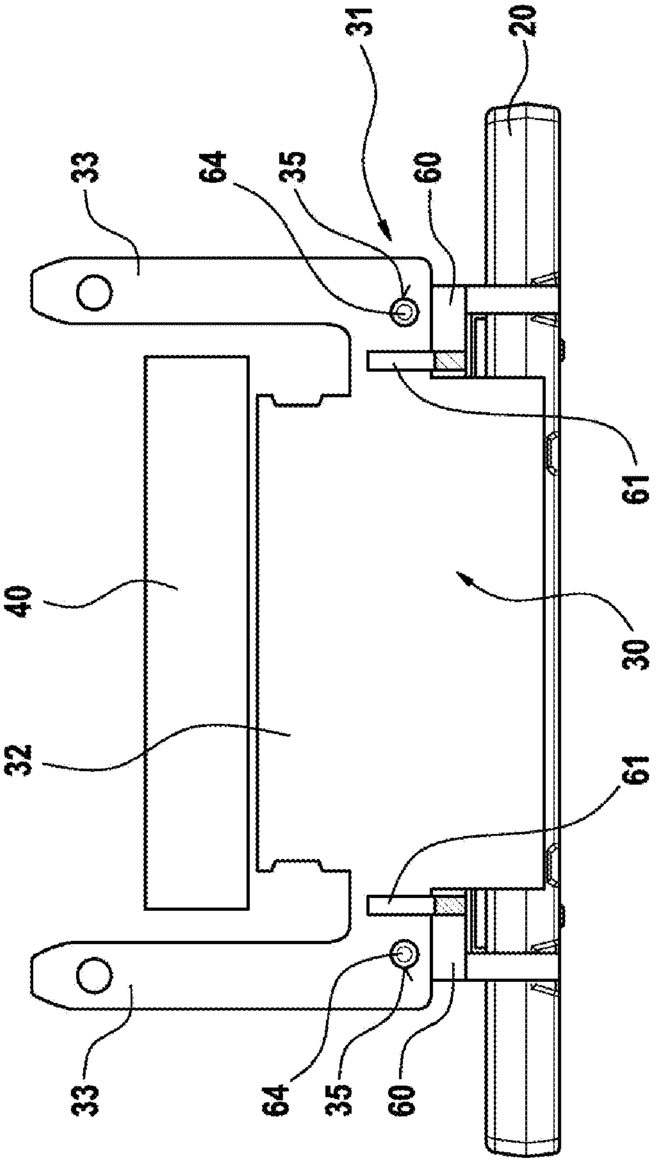

FIG. 1 shows one exemplary embodiment of the electronic module 1. FIG. 2 shows an associated cross-section through the exemplary embodiment of the electronic module from FIG. 1. The electronic module 1 comprises a first circuit board 10 with an upper side 11 and an underside 12 facing away from the upper side 11. The electronic module 1 further comprises a flexible second circuit board 30 and an electronics unit 20. The first circuit board 10 is used to, e.g., control the electronics unit 20. The flexible second circuit board 30 is in electrical contact with both the first circuit board 10 and the electronics unit 20. The conductor tracks of the flexible second circuit board 30 are, e.g., used to transmit signals for controlling the electronics unit 20.

The electronics unit 20 can, e.g., be a power electronics unit. In this exemplary embodiment, the electronics unit 20 comprises a molded housing. For example, a support substrate is arranged in the housing, and electrical and/or electronic components are arranged on the support substrate. The support substrate can, for example, be a circuit support, in this exemplary embodiment a DBC substrate (Direct Bonded Copper). However, the support substrate can also be an AMB substrate (Active Metal Brazed), an IMS (Insulated Metal Substrate), a PCB (printed circuit board), or another substrate suitable for power modules. Various electrical and/or electronic components, e.g. power semiconductors such as field effect transistors like MIS-FETs (metal insulated semiconductor field effect transistors), IGBTs (insulated-gate bipolar transistors), power MOSFETs (metal oxide semiconductor field-effect transistors), and/or diodes, e.g. rectifier diodes, can be arranged on the support substrate. Furthermore, passive components such as resistors or capacitors can also be arranged on the support substrate as electrical and/or electronic components. The support substrate can also comprise conductor tracks (not shown in the drawings). The conductor tracks of the support substrate can be designed as high-current-capable conductor surfaces, as in this exemplary embodiment. The electrical and/or electronic components can be connected to each other or to other electrical and/or electronic elements arranged outside the electronics unit 20 (not shown in the drawings) in an electrically conductive manner via, for example, the conductor tracks of the support substrate, via bonding wires, or other suitable electrically conductive contact elements, e.g. by soldering or sintering. The electronics unit 20 comprises connection points, where the electronics unit 20 is electrically contacted by the flexible second circuit board 30.

The electronic module 1 can also comprise a cooling element (not shown in the drawings), by means of which the electronics unit 20 is cooled. The cooling element can, e.g., be made of a material with advantageous thermal conductivity, e.g. aluminum or copper. The cooling element can, e.g., be designed as a plate. For example, structures to improve heat dissipation, such as ribs, pins, or channels, can be formed on the cooling element.

The electronic module 1 further comprises a first circuit board 10. The first circuit board 10 has an upper side 11 and an underside 12 facing away from the upper side 11. The first circuit board 10 is arranged in the electronic module 1 such that the underside 12 of the first circuit board 10 faces the electronics unit 20. The first circuit board 10 can be a rigid circuit board, for example a circuit board in FR4 design or of higher quality, for example a circuit board made of glass fiber reinforced epoxy resin. However, the first circuit board 10 can also be an HDI circuit board (High Density Interconnect circuit board), an LTCC (Low Temperature Cofired Ceramics) or another suitable rigid or flexible circuit board. The first circuit board 10 comprises, for example, one or multiple electrical and/or electronic components (not shown in the drawings) which are connected to one another by conductor tracks (not shown in the drawings), which elements together form, for example, a control circuit for the electronics unit 20.

A plug-in connector 40 is arranged on the first circuit board 10. The plug connector 40 is provided for making electrical contact with the first printed circuit board 10. A plug-in region 32 can be plugged into the plug-in connector 40 for this purpose. The plug-in connector 40 has a plurality of contact points that are provided to make contact with conductor tracks of the flexible second circuit board 30. The contact points in the plug-in connector 40 are used for making electrical contact with the first circuit board 10. If the plug-in region 32 of the second flexible circuit board 30 is plugged into the plug-in connector 40, electrical connections are established between the contacting points in the plug-in connector 40 and the conductor tracks of the second flexible circuit board 30. In this exemplary embodiment, the circuit board 10 is designed as a control circuit which is provided to control the electronics unit 20. For this purpose, the contact points in the plug-in connector 40 of the circuit board 10 are connected to the connection points of the electronics unit 20 in an electrically conductive manner by means of the flexible second circuit board 30. The plug-in connector 40 is arranged on the underside 12 of the first circuit board 10. The plug-in connector 40 faces the electronics unit 20. The plug-in connector 40 is fastened to the underside 12 of the first circuit board 10. The plug-in connector 40 protrudes from the underside 12 of the first circuit board towards the electronics unit 20. To accommodate the plug-in region 32 of the second flexible circuit board 30, the plug-in connector 40 comprises a receiving opening that faces the electronics unit 2. The plug-in connector 40 can, e.g., be designed as an FPC plug-in connector.

The electronic module 1 further comprises a flexible second circuit board 30. The flexible second circuit board 30 can, for example, be designed as an FPC (flexible printed circuits), in particular as an FPC connector. The flexible second circuit board 30, for example, has a considerable plastic bending capacity. The flexible second circuit board 30 is used to connect electronic modules. The electronic module is in this case arranged on the first circuit board 10 is connected to the electronics unit 20 by the second flexible circuit board 30. The flexible second circuit board 30 can, for example, comprise a printed circuit built up on a flexible plastic support, for example polyimide, mylar, nylon, or polyester film. Copper, for example, can be used as a conductor material. The contact regions can, e.g., also be gold-plated. The flexible second circuit board 30 comprises a region that is arranged on the electronics unit 20, where the board is electrically connected to connection points of the electronics unit 20. The flexible second circuit board 30 can, for example, be welded to the connection points of the electronics unit 20.

The flexible second circuit board 30 further comprises a connection region 31, where the flexible second circuit board 30 is electrically connected to the first circuit board 10. The connection region 31 of the second flexible circuit board 10 comprises a plug-in region 32 and at least one gripping region 33. In the exemplary embodiment shown in the drawings, the connection region comprises a plug-in region 32 and two gripping regions 33. The plug-in region 32 is arranged between the two gripping regions 33. The plug-in region 32 is designed for making electrical contact between the flexible second circuit board 30 and the plug-in connector 40 of the first circuit board 10. For this purpose, contact points are formed on the plug-in region 32 of the flexible second circuit board 30. The contact points on the plug-in region 32 of the flexible second circuit board 30 are, for example, ends of conductor tracks in the flexible second circuit board 30. The plug-in region 32 of the flexible second circuit board 30 is plugged into the plug-in connector 40 of the first circuit board 10 in a plug-in direction R. The contact points of the plug-in region 32 are thus in electrically conductive contact with the contact points of the plug-in connector 40, and the flexible second circuit board 30 is thus connected to the first circuit board 10 in an electrically conductive manner. The plug-in direction R indicates the direction in which the plug-in region 31 of the flexible second circuit board 30 is plugged into the plug-in connector 40. For example, the plug-in direction R is perpendicular to the first circuit board 10.

The plug-in region 32 and the gripping regions 33 are, e.g., each designed to be flat and to extend flatly in the same plane. The plug-in region 32 and the gripping regions 33 extend in the plug-in direction R. The plug-in region 32 is essentially rectangular, for example. The gripping regions 33 are, e.g., each designed to be tongue-shaped. The plug-in region 32 and the gripping regions 33 are formed in the same plane, whereas the plug-in region 32 is arranged in the plane between the two gripping regions 33. The gripping regions 33 extend beyond the plug-in region 32 in the plug-in direction R. At the ends of the gripping regions 33, which are arranged on the upper side 11 of the first circuit board 10, a structure can be formed which facilitates gripping of the gripping region 33. In the exemplary embodiment shown herein, a recess is formed in each of the gripping regions 33, in which a gripping tool can engage. The connection region 31 with the plug-in region 32 and the gripping regions 33 is essentially fork-shaped, for example.

The connection region 31 with the plug-in region 32 and the gripping regions 33 forms one end of the flexible second circuit board 30, at which the flexible circuit board 30 is connected to the first circuit board 10. The connection region 31 with the plug-in region 32 and the gripping regions 33 is designed as a rigid region of the flexible second circuit board 30. The flexible second circuit board 30 is stiffened in the connection region 31 and is therefore rigid in the connection region 31. The plug-in region 32 is plugged into the plug-in connector 40 on the underside 12 of the first circuit board 10 and is thus arranged on the underside 12 of the first circuit board 10. The gripping regions 33 protrude next to the plug-in connector 40 in the plug-in direction R through recesses 13 in the first circuit board 10 to the upper side 11 of the first circuit board 10. A recess 13 is provided in the first circuit board 10 for each gripping region 33. In the exemplary embodiment shown herein, the circuit board 10 comprises two recesses 13 for the gripping regions 33. The plug-in connector 40 is arranged between the two recesses 13. The recesses 13 are formed, for example, as slots in the first circuit board 10. The slots extend, for example, in a direction perpendicular to the plug-in direction R, in which the receptacle for the plug-in region 32 in the plug-in connector 40 also extends. The gripping regions 33 protrude from the recesses 13 on the upper side 11 of the first circuit board 10, so that they can be gripped on the upper side 11.

The electronic module 1 further comprises a centering device 50. The centering device 50 is arranged between the first circuit board 10 and the electronics unit 20. The centering device 50 is plate-shaped, for example. The centering device 50 can also serve, for example, as a support plate for the first circuit board 10. The flexible second circuit board 30 extends through the centering device 50. A centering opening 51 is formed in the centering device 50 for this purpose. The centering opening 51 is, e.g., slot-shaped. The flexible second circuit board 30 extends through the centering opening 51 in the centering device 50, in particular in the plug-in direction R. As a result of the flexible second circuit board 30 being guided through the centering opening 51 in the plug-in direction R, the connection region 31 of the flexible second circuit board 30 is also oriented in the plug-in direction R. The centering device 50 can comprise an additional element 55, which is arranged in the centering device 50, for example in the form of a plate, and in which the centering opening 51 is formed. The centering opening 50 can, for example, be at least partially funnel-shaped and become narrower in the plug-in direction R away from the electronics unit 2. The flexible second circuit board 30 can thus be plugged particularly well and easily into the centering opening 51 of the centering device 50 from the side of the centering device 50 facing the electronics unit 2. Furthermore, projections (not shown in the drawings) can be provided next to the centering opening 51 and serve to guide and orient the flexible second circuit board 30 in the plug-in direction R.

The first circuit board 10 is oriented with the centering device 50. The first circuit board 10 is oriented with the centering device 50 such that the flexible circuit board 30 simultaneously protrudes through the centering opening 51 in the centering device 50 and the recesses 13 in the first circuit board 10. Centering elements 52, e.g. in the form of pins, are formed on the centering device 50. The centering elements 52 project from the centering device 50 in the plug-in direction R in the direction of the first circuit board 10. The centering elements 52 of the centering device 50 serve to orient the first circuit board 10 relative to the centering device 50. The centering elements 52 can, for example, protrude through orientation openings 14 in the first circuit board 10. The first circuit board 10 can thus be oriented with the centering elements 52, and thus with the centering device 50.

Furthermore, the centering device 50 is oriented relative to the electronics unit 20. For this purpose, the electronic module 1 can comprise further components (not shown in the drawings), which establish a connection between the centering device 50 and the electronics unit 2. For example, the electronics unit 2 can be connected to the centering unit 50 via a cooling element and/or a housing and thus be oriented relative to it.

The electronics unit 20 can further comprise a holding device 60. The holding device 60 is designed to hold the flexible second circuit board 30 and orient it in the plug-in direction R. The holding device 60 orients the connection region 31 of the flexible second circuit board 30 in the plug-in direction R such that the connection region 31 protrudes through the centering opening 51 in the centering device 50 and the recesses 13 in the first circuit board 10. The connection region 31 of the flexible second circuit board 30 can be clipped into the holding device 60 and thus fastened to the electronics unit 20 and oriented in the plug-in direction R. If the centering device 50 and the first circuit board 10 are mounted above the electronics unit 20, then the connection region 31 of the flexible second circuit board 30 passes through the centering opening 51 of the centering device 50 and the recesses 13 in the first circuit board 10. If the centering device 50 and the first circuit board 10 are then mounted, a gripping tool can grip the gripping regions 33 of the connection region 31 on the upper side 11 of the first circuit board 10 and pull the connection region 31 in the direction of the plug-in direction R, so that the plug-in region 32 is plugged into the plug-in connector 40. The holding device 60 on the electronics unit 20 is designed such that the connection region 31 is released from the holding device 60 when the gripping regions 33 are pulled in the plug-in direction R. The holding device 60 can, e.g., comprise one or more clips for this purpose. The holding device can, for example, comprise a first holding part 61 and a second holding part 62, as in the exemplary embodiment shown herein. The first holding part 61 and the second holding part 62 protrude, for example, in the plug-in direction R. The first holding part 61 and the second holding part 62 are spaced apart by an intermediate space 63. The plug-in region 31 of the flexible second circuit board 30 is partially arranged in the intermediate space 63 between the first holding part 61 and the second holding part 62. The plug-in region 31 of the flexible second circuit board 30 is arranged, for example, between the first holding part 61 and the second holding part 62. The connection region 31 is thus held by the holding device 60 and oriented in the plug-in direction R. Furthermore, a latching element 64, for example a latching lug, can be formed on the first holding part 61 and/or on the second holding part 62. Furthermore, a latching opening 35 complementary to the latching element 64 can be formed in the connection region 31 of the flexible second circuit board 30, into which the latching element 64 can be latched. The latching element 64 protrudes into the intermediate space 63, for example. When the connection region 31 is latched, it is oriented in the plug-in direction R. By pulling the gripping regions 33 in the plug-in direction R, the connection region 31 is released from the latching mechanism in the holding device 60 and the plug-in region 32 is plugged into the plug-in connector 40.

Of course, further exemplary embodiments and mixed forms of the illustrated exemplary embodiments are also possible.

The invention claimed is:

1. An electronic module (1) comprising: a first circuit board (10) with an upper side (11) and an underside (12) facing away from the upper side (11), wherein a plug-in connector (40) for making electrical contact with the first circuit board (10) is arranged on the first circuit board (10), further comprising an electronics unit (20), wherein the electronics unit (20) is arranged on the underside (12) of the first circuit board (10), wherein the electronics unit (20) is electrically contacted by a flexible second circuit board (30), wherein the flexible second circuit board (30) comprises a connection region (31) with a plug-in region (32), wherein the plug-in region (32) of the flexible second circuit board (30) is plugged into the plug-in connector (40) of the first circuit board (10) in a plug-in direction (R), and the electronics unit (20) is thereby electrically contacted by the first circuit board (10), wherein the plug-in connector (40) of the first circuit board (10) is arranged on the underside (12) of the first circuit board (10), wherein the connection region (31) of the flexible second circuit board (30) comprises at least one gripping region (33), wherein the gripping region (33) projects beyond the plug-in region (32) in the plug-in direction (R), wherein the gripping region (33) protrudes through a recess (13) in the first circuit board (10), from the underside (12) of the first circuit board (10) to the upper side (11) of the first circuit board (10).

2. The electronic module according to claim 1, wherein at least two gripping regions (33) are formed on the flexible second circuit board (30), wherein the plug-in region (32) of the flexible second circuit board (30) and the plug-in connector (40) are arranged between the gripping regions (33) of the second circuit board (32).

3. The electronic module according to claim 1, wherein the plug-in region (32) and/or the gripping region (33) are configured as a rigid region of the flexible second circuit board (30).

4. The electronic module according to claim 1, wherein a centering device (50) is arranged between the first circuit board (10) and the electronics unit (20), wherein the flexible second circuit board (30) passes through a centering opening (51) of the centering device (50) and the plug-in region (32) of the flexible second circuit board (30) is thereby oriented, wherein at least one centering element (52) is formed on the centering device (50), which centering element is in contact with the first circuit board (10) and through which said centering element the first circuit board (10) is oriented on the centering device (50).

5. The electronic module according to claim 4, wherein the centering element (52) is configured as a pin (52), which protrudes through an orientation opening (14) formed in the first circuit board (10).

6. The electronic module according to claim 4, wherein the centering device (50) is configured as a plate.

7. The electronic module according to claim 1, wherein a holding device (60) for holding and orienting the connection region (31) of the flexible second circuit board (30) is formed on the electronics unit (20).

8. The electronic module according to claim 7, wherein the connection region (31) of the flexible second circuit board (30) is held in a first position by the holding device (60) and is oriented in the plug-in direction (R), and the connection region (31) of the flexible second circuit board (30) can be released from the holding device (60) by pulling on the gripping region (33) in the plug-in direction (R).

9. The electronic module according to claim 7, wherein the holding device (60) comprises a first holding part (61) and a second holding part (62), wherein the first holding part (61) and the second holding part (62) are spaced apart by an intermediate space (63), wherein the connection region (31) of the flexible second circuit board (30) can be clamped into the intermediate space (63) between the first holding part (61) and the second holding part (62), so that the connection region (31) is held by the holding device (60) and oriented in the plug-in direction (R).

10. The electronic module according to claim 9, wherein a latching element (64) is formed on the first holding part (61) and/or on the second holding part (62) and projects into the intermediate space (63), wherein a latching opening (35) complementary to the latching element (64) is formed on the connection region (31) of the flexible circuit board (30), into which the latching element (64) can be latched.

11. The electronic module according to claim 1, wherein the electronic module is an electronic power module for hybrid vehicles or electric vehicles.

12. The electronic module according to claim 1, wherein the electronics unit (20) is a power electronics unit.

13. The electronic module according to claim 4, wherein the flexible second circuit board (30) passes through a centering opening (51) of the centering device (50) in the plug-in direction (R).

14. The electronic module according to claim 6, wherein the centering device (50) is configured as a support plate for the first circuit board (10).

15. The electronic module according to claim 8, wherein the holding device (60) comprises a first holding part (61) and a second holding part (62), wherein the first holding part (61) and the second holding part (62) are spaced apart by an intermediate space (63), wherein the connection region (31) of the flexible second circuit board (30) can be clamped into the intermediate space (63) between the first holding part (61) and the second holding part (62), so that the connection region (31) is held by the holding device (60) and oriented in the plug-in direction (R).

16. The electronic module according to claim 15, wherein a latching element (64) is formed on the first holding part (61) and/or on the second holding part (62) and projects into the intermediate space (63), wherein a latching opening (35) complementary to the latching element (64) is formed on the connection region (31) of the flexible circuit board (30), into which the latching element (64) can be latched.

* * * * *